(12) United States Patent
Stimson et al.

(10) Patent No.: US 6,254,738 B1
(45) Date of Patent: Jul. 3, 2001

(54) USE OF VARIABLE IMPEDANCE HAVING ROTATING CORE TO CONTROL COIL SPUTTER DISTRIBUTION

(75) Inventors: Bradley O. Stimson, San Jose; Kenneth Smyth, Santa Clara; Praburam Gopalraja, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/052,868

(22) Filed: Mar. 31, 1998

(51) Int. Cl.$^7$ .................................................. C23C 14/34
(52) U.S. Cl. ......................... 204/192.12; 204/298.06; 204/298.08; 204/298.14; 204/298.34; 156/345; 118/723 I; 336/132; 216/68; 438/800
(58) Field of Search ..................... 204/192.12, 298.06, 204/298.08, 298.14, 298.34; 156/345 C; 118/723 I; 336/132; 216/68; 438/800

(56) References Cited

U.S. PATENT DOCUMENTS

| | | | |
|---|---|---|---|
| 3,475,702 | 10/1969 | Ainsworth | 333/17 |
| 3,569,777 | * 3/1971 | Beaudry | 315/111 |
| 3,594,295 | 7/1971 | Meckel et al. | 204/142 |
| 3,675,093 | 7/1972 | Russo et al. | 317/249 R |
| 3,872,278 | * 3/1975 | Boom | 219/121 P |
| 4,229,826 | 10/1980 | Wanzer | 455/83 |
| 4,272,743 | * 6/1981 | Evans | 333/176 |
| 4,284,490 | 8/1981 | Weber | 204/298 |
| 4,336,118 | 6/1982 | Patten et al. | 204/192 EL |
| 4,362,632 | 12/1982 | Jacob | 422/183.04 |
| 4,441,092 | 4/1984 | Thornton et al. | 336/130 |
| 4,626,312 | 12/1986 | Tracy | 156/345 |
| 4,661,228 | 4/1987 | Mintz | 204/192.25 |
| 4,712,112 | * 12/1987 | Carr | 343/788 |
| 4,716,491 | 12/1987 | Ohno et al. | 361/230 |
| 4,792,732 | 12/1988 | O'Loughlin | 315/334 |
| 4,865,712 | 9/1989 | Mintz | 204/298 |
| 4,871,421 | 10/1989 | Ogle et al. | 156/643 |
| 4,918,031 | 4/1990 | Flamm et al. | 437/225 |
| 4,941,915 | 7/1990 | Matsuoka et al. | 204/298.12 |
| 4,990,229 | 2/1991 | Campbell et al. | 204/298.06 |
| 4,999,096 | 3/1991 | Nihei et al. | 204/192.3 |
| 5,091,049 | 2/1992 | Campbell et al. | 156/643 |
| 5,122,251 | 6/1992 | Campbell et al. | 204/298.06 |
| 5,146,137 | 9/1992 | Gesche et al. | 315/111.21 |
| 5,178,739 | 1/1993 | Barnes et al. | 204/192.12 |
| 5,195,045 | 3/1993 | Keane et al. | 364/482 |
| 5,234,560 | 8/1993 | Kadlec et al. | 204/192.12 |
| 5,241,245 | 8/1993 | Barnes et al. | 315/111.41 |
| 5,280,154 | 1/1994 | Cuomo et al. | 219/121.52 |
| 5,292,393 | 3/1994 | Mayden et al. | 156/345 |
| 5,304,279 | 4/1994 | Coultas et al. | 156/345 |
| 5,346,578 | 9/1994 | Benzing et al. | 156/345 |
| 5,361,016 | 11/1994 | Ohkawa et al. | 315/111.41 |
| 5,392,018 | 2/1995 | Collins et al. | 336/155 |
| 5,397,962 | 3/1995 | Moslehi | 315/111.51 |

(List continued on next page.)

FOREIGN PATENT DOCUMENTS 0520519   12/1992   (EP) ................................ H01J/37/32

(List continued on next page.)

OTHER PUBLICATIONS

PCT Search Report issued on Jul. 22, 1999 in PCT/US99/06441 (Counterpart of U.S. Ser. No. 09/052,868).

(List continued on next page.)

Primary Examiner—Nam Nguyen
Assistant Examiner—Steven H. VerSteeg
(74) Attorney, Agent, or Firm—Konrad Raynes & Victor

(57) ABSTRACT

Variable reactances in an impedance-matching box for an RF coil, in a plasma deposition system for depositing a film of sputtered target material on a substrate, can be varied by rotating inductor cores during the deposition process so that the RF coil and substrate heating, and the film deposition, are more uniform due to "time-averaging" of the RF voltage distributions along the RF coil.

72 Claims, 8 Drawing Sheets

U.S. PATENT DOCUMENTS

| | | | |
|---|---|---|---|
| 5,401,350 | 3/1995 | Patrick et al. | 156/345 |
| 5,404,079 | 4/1995 | Ohkuni et al. | 315/111.81 |
| 5,418,431 | 5/1995 | Williamson et al. | 315/111.51 |
| 5,424,691 | 6/1995 | Sadinsky | 333/17.3 |
| 5,429,070 | 7/1995 | Campbell et al. | 118/723 R |
| 5,429,995 | 7/1995 | Nishiyama et al. | 437/238 |
| 5,430,355 | 7/1995 | Paranjpe | 315/111.21 |
| 5,473,291 | 12/1995 | Brounley | 333/17.3 |
| 5,503,676 | 4/1996 | Shufflebotham et al. | 118/723 MR |
| 5,571,366 | 11/1996 | Ishii et al. | 156/345 |
| 5,573,595 | 11/1996 | Dible | 118/723 MP |
| 5,585,766 | 12/1996 | Shel | 333/17.3 |
| 5,591,493 | 1/1997 | Paranjpe et al. | 427/569 |
| 5,639,357 | 6/1997 | Xu | 204/192.3 |
| 5,643,364 * | 7/1997 | Zhao et al. | 118/723 E |
| 5,688,357 | 11/1997 | Hanawa | 156/345 |
| 5,689,215 | 11/1997 | Richardson et al. | 333/17.3 |
| 5,716,451 | 2/1998 | Hama et al. | 118/723 |
| 5,759,280 | 6/1998 | Holland et al. | 118/723 I |
| 5,793,162 | 8/1998 | Barnes et al. | 315/111.21 |
| 5,795,429 * | 8/1998 | Ishii et al. | 156/345 |
| 5,800,619 | 9/1998 | Holland et al. | 118/723 I |
| 5,800,688 * | 9/1998 | Lantsman et al. | 204/298.11 |
| 5,851,600 | 12/1998 | Horiike et al. | 427/535 |
| 5,874,704 * | 2/1999 | Gates | 219/121.43 |

FOREIGN PATENT DOCUMENTS

| | | | |
|---|---|---|---|
| 0714106 | 5/1996 | (EP) | H01F/29/14 |
| 0878826 | 11/1998 | (EP) | H01J/37/34 |
| 2162365 | 1/1986 | (GB) | H01J/27/02 |
| 2231197 | 11/1990 | (GB) | H01J/37/32 |
| 61-190070 | 8/1986 | (JP) | C23C/14/34 |
| 63-246814 | 10/1988 | (JP) | H01L/21/205 |
| 6232055 | 8/1994 | (JP) | H01L/21/205 |
| 6283470 | 10/1994 | (JP) | H01L/21/302 |
| 7176398 | 7/1995 | (JP) | H05H/1/46 |
| 7176399 | 7/1995 | (JP) | H05H/1/46 |
| 8153712 | 6/1996 | (JP) | H01L/21/3065 |
| 8288259 | 11/1996 | (JP) | H01L/21/3065 |
| 8606923 | 11/1986 | (WO) | H05H/1/46 |
| WO972474 | 7/1997 | (WO) | H01J/37/32 |
| WO997913 | 2/1999 | (WO) | C23C/14/34 |

OTHER PUBLICATIONS

EPO Search Report issued Jul. 22, 1999 in 98303794.6.

Sansonnens, L., et al., A voltage uniformity study in large–area reactors for RF plasma deposition, Plasma Sources Sci. Technol. 6 (1977) 170–178.

EPO Search Report issued Aug. 13, 1999 in 98303813.4.

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus,"*J. Vac. Sci. Technol.*, vol. A7, pp. 151–158, 1989.

S.M. Rossnagel et al., "Magnetron Sputter Deposition with High Levels of Metal Ionization," *Appl. Phys. Lett.*, vol. 63, pp. 3285–3287, 1993.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

U.S. patent application serial No. 08/907,382, filed Aug. 7, 1997 (Aty. Dk. 1957/PVD/DV).

U.S. patent application serial No. 08/857,921, filed May 16, 1997 (Aty. Dk. 1737/ND/PVD/DV).

U.S. patent application serial No. 08/857,720, filed May, 16, 1997 (Aty. Dk. 1800/PVD/DV).

U.S. patent application serial No. 08/908,341, filed Aug. 7, 1997 (Aty. Dk. 1873/PVD/DV).

* cited by examiner

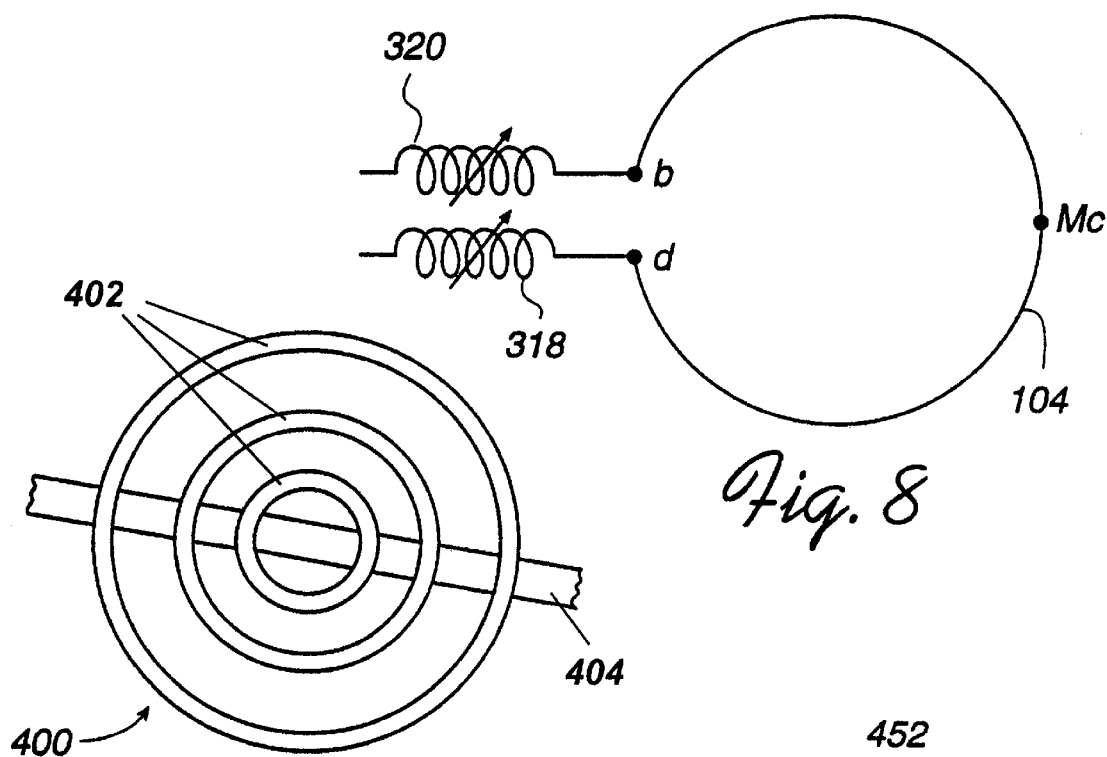
Fig. 8
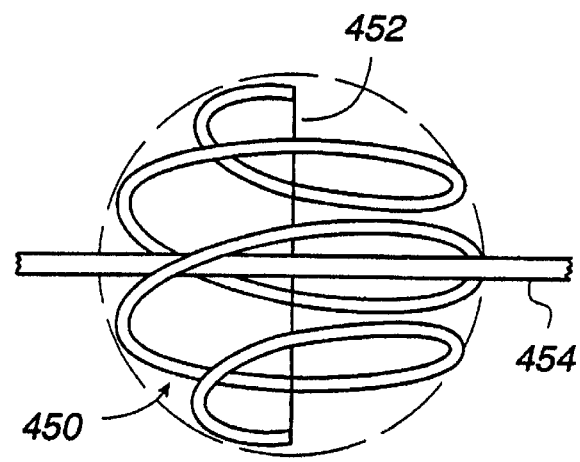
Fig. 10A
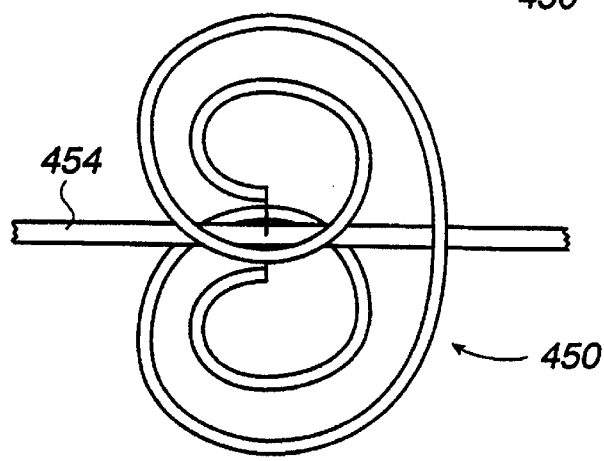
Fig. 9
Fig. 10B

USE OF VARIABLE IMPEDANCE HAVING ROTATING CORE TO CONTROL COIL SPUTTER DISTRIBUTION

FIELD OF THE INVENTION

The present invention relates to plasma generators, and more particularly, to a method and apparatus for generating a plasma to sputter deposit a layer of material or to etch a layer of material in the fabrication of semiconductor devices.

BACKGROUND OF THE INVENTION

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target to the substrate, being deposited, at angles which are oblique to the surface of the substrate. As a consequence, materials deposited in etched openings, including trenches and holes of semiconductor devices having openings with a high depth to width aspect ratio, may not adequately coat the walls of the openings, particularly the bottom walls. If a large amount of material is being deposited, the deposited material can bridge over, causing undesirable cavities in the deposition layer. To prevent such cavities, sputtered material can be redirected into substantially vertical paths between the target and the substrate by negatively biasing (or self-biasing) the substrate and positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density, in the range of $10^{11}$–$10^{13}$ ions/cm$^3$.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in a steady state. As shown in U.S. Pat. No. 4,362,632, for example, current through a coil is supplied by an RF generator coupled to the coil through an impedance-matching network, such that the coil acts as the first windings of a transformer. The plasma acts as a single turn second winding of a transformer.

Although ionizing the deposition material facilitates deposition of material into high aspect ratio channels and vias, many sputtered contact metals have a tendency to deposit more thickly in the center of the wafer as compared to the edges. This "center thick" deposition profile is undesirable in many applications where a uniform deposition thickness is needed.

As described in copending application Ser. No. 08/680,335 now abandoned entitled "Coils for Generating a Plasma and for Sputtering," filed Jul. 10, 1996 (Attorney Docket # 1390CIP/PVD/DV) and assigned to the assignee of the present application, it has been recognized that the coil itself may provide a source of sputtered material to supplement the deposition material sputtered from the primary target of the chamber. Application of an RF signal to the coil can cause the coil to develop a negative bias which will attract positive ions which can impact the coil causing material to be sputtered from the coil. Because the material sputtered from the coil tends to deposit more thickly at the periphery of the wafer, the center thick tendency for material sputtered from the primary target can be compensated by the edge thick tendency for material sputtered from the coil. As a result, uniformity can be improved.

As set forth in copending application Ser. No. 08/957,720 filed May 16, 1997 now U.S. Pat. No. 5,992,435, entitled "USE OF VARIABLE IMPEDANCE HAVING ROTATING CORE TO CONTROL COIL SPUTTER DISTRIBUTION" and assigned to the assignee of the present application, it has been recognized that the sputtering rate for material sputtered from the coil may be nonuniform around the perimeter of the coil. Hence the ability to achieve a desired level of uniformity may be adversely affected in some applications.

It has further been recognized that the coil can develop a hot spot which can cause uneven heating of the substrate. This uneven heating of the coil can also cause reliability problems in that portions of the coil may become too hot and deform, and may also cause particulates deposited on the coil to flake off and contaminate the substrate. Since single turn coils are typically required to carry a relatively high level of current, these problems can be more pronounced in such single turn coils.

SUMMARY OF THE PREFERRED EMBODIMENTS

It is an object of the present invention to provide a method and apparatus for etching or sputter depositing a layer which improves uniformity and which obviates, for practical purposes, the above-mentioned limitations.

These and other objects and advantages are achieved by a plasma generating apparatus in which, in accordance with one aspect of the invention, an impedance-circuit coupled to an RF coil has a rotating core variable reactance for shifting RF voltage distributions along the length of the RF coil. It has been found that the reactance between the RF coil and the ground can be cyclicly and continuously tuned during a sputtering operation by rotating the core of at least one inductor to move or vary the RF voltage distributions along the RF coil so that minima and maxima points of the RF voltage distribution along the coil are not fixed at particular regions of the coil. Instead, the RF voltage distribution can be repeatedly moved around the coil in a back and forth rotational or other motion. In addition, the ionization pattern of the plasma associated with the RF voltage distribution may be similarly moved in conjunction with the movement of the RF voltage distribution. As a consequence, the RF coil and substrate can be more uniformly and symmetrically heated, by time-averaging, because a "hot spot" of sputtering can be avoided. In addition, the coil itself may be more uniformly sputtered and the deposition material can be more uniformly deposited.

In another aspect of the present invention, the reactance of the tunable variable reactance can be repeatedly changed using inductors having offsetting rotating cores during the deposition to shift the voltage distributions along the coil, without requiring corresponding impedance rematches as a result of the impedance changes. In many applications, it is desirable to match the impedance of the coil and associated impedance circuitry to the impedance of the RF generator so as to minimize the reflection of RF energy back to the generator. Here, the voltage distributions can be rotated during the deposition without having to rematch impedances because the combined impedances of the coil and the impedance network can remain substantially constant, even though the reactance of the tunable variable reactance is repeatedly changed during the deposition.

In one embodiment, the tunable variable reactance includes a pair of tunable inductors and a pair of linked rotating core pieces movably disposed within the pair of tunable inductors in which one of the pair of tunable inductors is positioned between the RF coil and the ground. As explained in greater detail below, the core pieces compensate each change in the inductive reactance of one tunable inductor of the pair with a corresponding substantially equal but opposite change in the inductive reactance of the other tunable inductor of the pair so as to keep the sum of the inductive reactances of the tunable inductors of the pair substantially constant. As a result, the need to rematch the RF coil impedance, once the RF coil impedance has been adequately matched, can be reduced or eliminated.

BRIEF DESCRIPTION OF THE DRAWINGS

FIG. 8 is a schematic view of a coil and a pair of inductors of the impedance-matching network and the plasma generating chamber of FIG. 2.

FIG. 9 is a schematic view of a rotatable core piece for a pair of tunable inductor coils in accordance with another embodiment of the present invention.

FIGS. 10A and 10B are perspective schematic views of a rotatable core piece for a tunable inductor coil in accordance with yet another embodiment of the present invention.

DETAILED DESCRIPTION OF THE DRAWINGS

Figure 1:
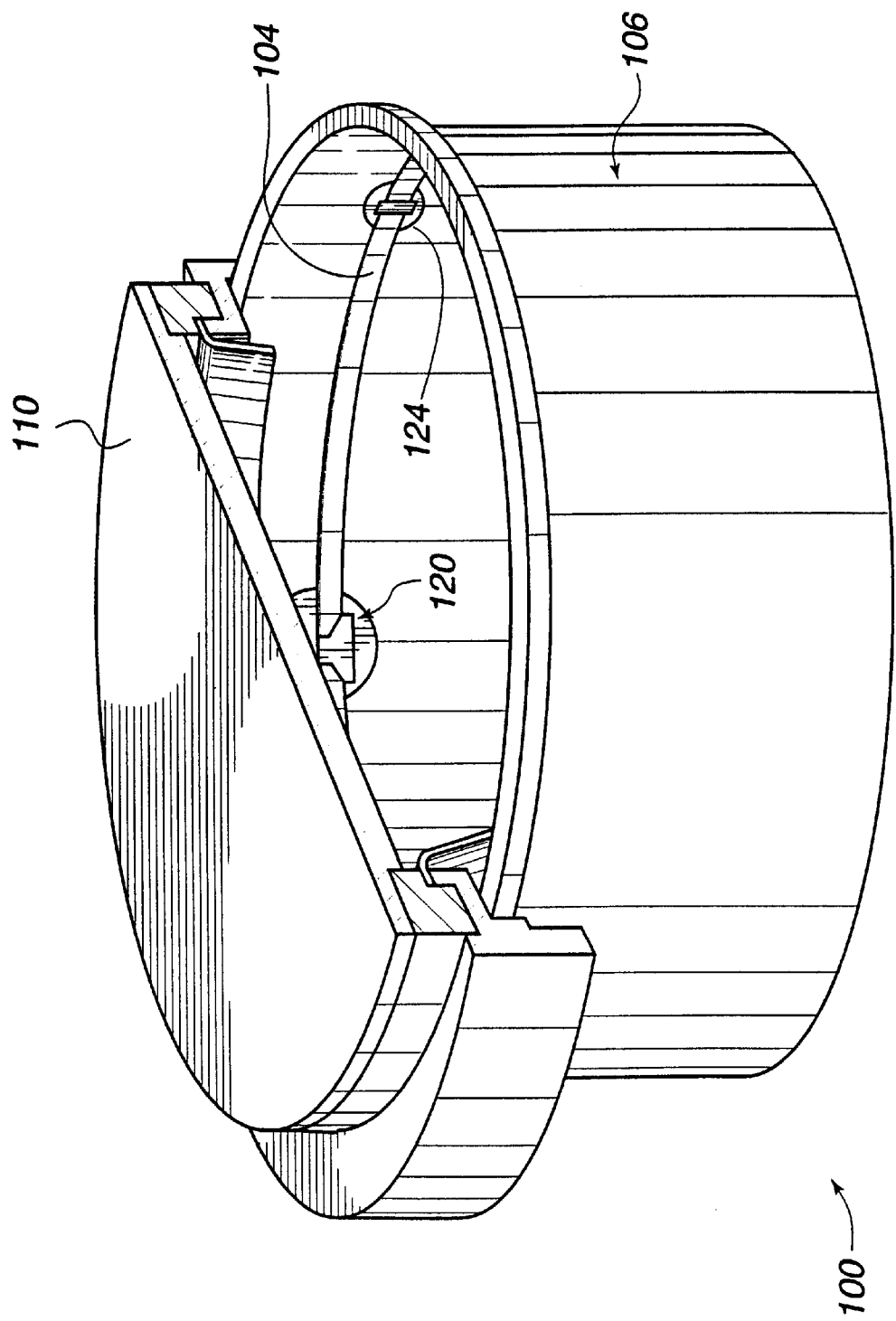
FIG. 1 is a perspective, partial cross-sectional view of a plasma generating chamber for sputter depositing a layer in a manner in accordance with an embodiment of the present invention.
Figure 2:
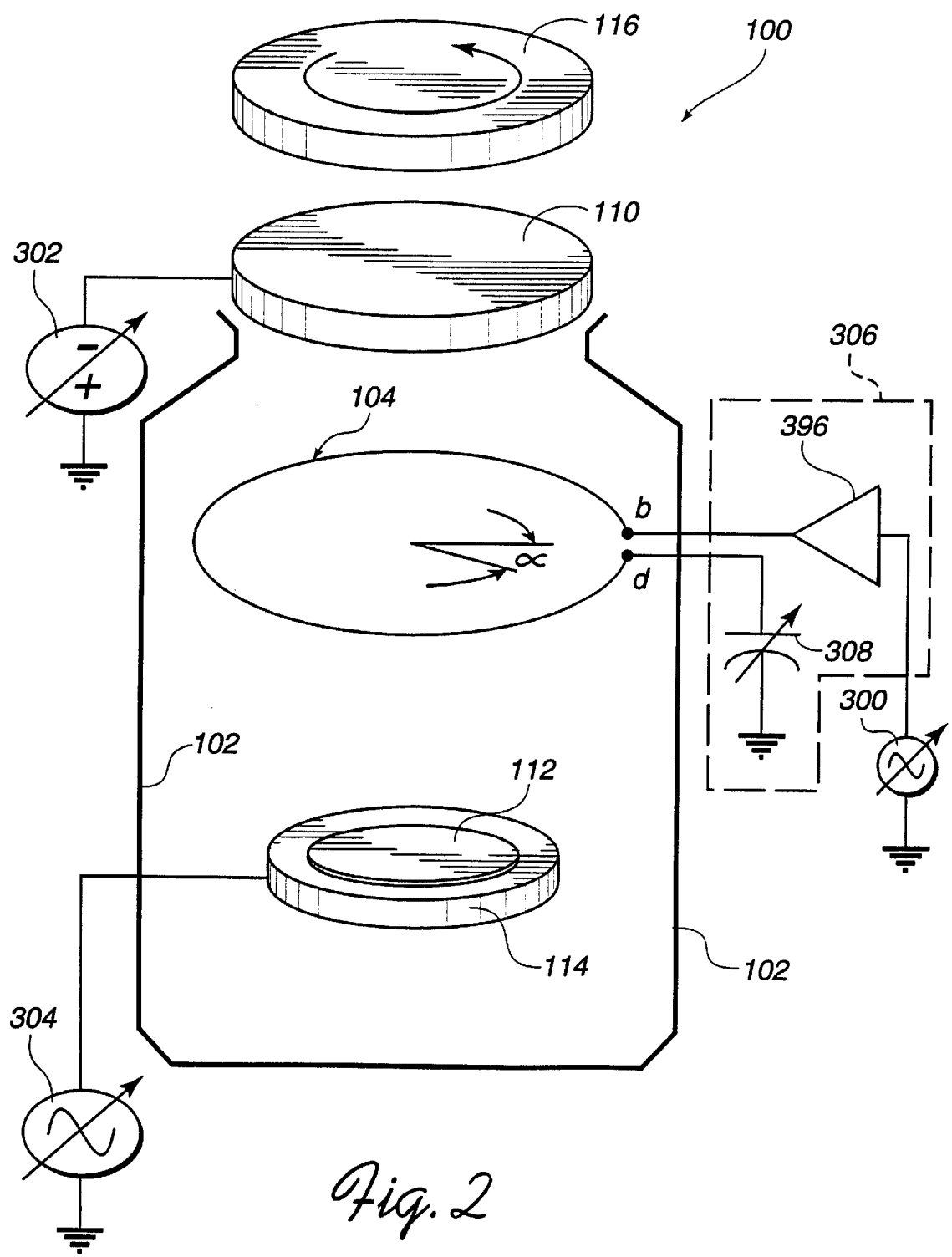
FIG. 2 is a schematic diagram of the electrical interconnections to the plasma generating chamber of FIG. 1.

Referring first to FIGS. 1–2, an example of a plasma generator used in accordance with an embodiment of the present invention comprises a substantially cylindrical plasma chamber 100 which is received in a vacuum chamber 102 (represented schematically in FIG. 2). The plasma chamber 100 of this embodiment has a helical coil 104 which is carried internally of the vacuum chamber walls by a chamber shield 106 which protects the interior walls of the vacuum chamber 102 from the material being deposited within the interior of the plasma chamber 100. In accordance with one aspect of the present invention, the reactance between the RF coil 104 and ground can be continuously or repeatedly tuned during a sputtering operation by an inductor having a rotating core to shift or rotate the RF voltage distributions along the RF coil 104, and to shift the associated ionization of the plasma. As a consequence, the RF coil 104 and substrate 112 are more uniformly and axially symmetrically heated, and the deposition material is more uniformly sputtered from the coil, by time-averaging. Further, by providing a second inductor having a second core rotating out of phase with the first rotating core, the need to rematch the RF coil impedance once the RF coil impedance has been adequately matched can be eliminated notwithstanding the fact that the reactance between the RF coil 104 and the ground is repeatedly changed to shift the voltage distributions along the RF coil 104.

An ion flux strikes a negatively biased target 110 positioned above the plasma chamber 100. The plasma ions eject material from the target 110 onto a substrate 112 which may be a wafer or other workpiece supported by a pedestal 114 at the bottom of the plasma chamber 100. An optional rotating magnet assembly 116 may be provided above the target 110 to produce magnetic fields which sweep over the face of the target 110 to promote uniform erosion by sputtering of the target 110.

Radio frequency (RF) energy from an RF generator 300 (FIG. 2) is radiated from the coil 104 into the interior of the plasma chamber 100, which energizes a plasma within the plasma chamber 100. The deposition material sputtered from the target 110 passes through the plasma energized by the coil 104 prior to being deposited on the substrate 112. A portion of the deposition material passing though the plasma is ionized by the plasma. The ionized deposition material is then attracted to a negative potential on the substrate 112. In this manner, the ionized deposition material is redirected to a more vertical path which facilitates depositing more material into high aspect ratio openings in the substrate. Although the illustrated embodiment is described in connection with sputter deposition, it is contemplated that the present invention is useful in connection with etching as well.

FIG. 2 includes a schematic representation of the electrical connections of the plasma generating apparatus of this illustrated embodiment. To sputter target material onto the substrate 112, the target 110 is preferably negatively biased by a variable DC power source 302 to attract the ions generated by the plasma. In the same manner, the pedestal 114 may be negatively biased by a variable RF power source 304 to bias the substrate 112 negatively to attract the ionized deposition material to the substrate 112. In an alternative embodiment, the pedestal 114 may be biased by a high frequency AC power source to bias the substrate 112 so as to attract the ionized deposition material more uniformly to the substrate 112. In yet another alternative embodiment, external biasing of the substrate 112 may be omitted.

One end b of the coil 104 is coupled to an RF source such as the output of an amplifier 396 and impedance-matching network 306, the input of which is coupled to the RF generator 300. The other end d of the coil 104 is coupled to ground, preferably through a capacitor 308, which may be a variable capacitor. The amplifier 396 and impedance-matching network 306 adjust the combined impedances of the RF coil 104 and the network 306 to match the impedance of the RF generator 300 so that RF energy will be efficiently transmitted from the RF generator 300 to the RF coil 104 rather than being reflected back to the generator 300.

As set forth above, it has been noted that the RF voltage distributions along the coil 104 can influence various properties of the plasma. These plasma properties including the plasma density and potential profiles, and ion bombardment of the coil 104 and substrate 112 being deposited. Because the instantaneous RF voltage distributions along the coil 104 are not uniform and are not axially symmetric about the symmetry axis of the coil 104, nonuniform and asymmetrical heating of both the coil 104 and the substrate 112 can occur as well as nonuniform sputtering of the coil and deposition of material on the substrate 112. Thus, nonuniform and asymmetrical heating of the coil 104 can cause reliability problems, in that portions of the coil 104 may become too hot and deform, and may also lead to the flaking of particulates deposited on the coil 104 which can contaminate the substrate 112. The nonuniform and asymmetrical instantaneous RF voltage distributions along the coil 104 and the consequent nonuniform effects can be most prominent when the coil 104 is a single turn coil.

In accordance with the present invention, an inductor having a rotating core is provided to vary the reactance between the RF coil 104 and the ground in repeating cycles during a sputtering operation to vary or move the RF voltage distributions along the RF coil 104, and thereby also rotate the ionization profile of the plasma. As the voltage profile is varied to continuously move the minimum, peak or other reference points of the voltage around the coil in an orbital or other path about the plasma region, the regions of plasma having varying ionization fractions, or rates may in effect rotate about an axis within the plasma region. As a consequence, the RF coil 104 and substrate 112 can be more uniformly and axially symmetrically heated, and the target material can be more uniformly deposited, by time-averaging, because the regions of highest to lowest ionization fraction (or plasma density) can more equally contribute to sputtering of the coil and target. In another aspect of the present invention, the need to rematch the RF coil impedance once the RF coil impedance has been adequately matched can be eliminated notwithstanding the fact that the reactance between the RF coil 104 and the ground is continuously or repeatedly changed to shift the voltage distributions along the RF coil 104.

Figure 3:
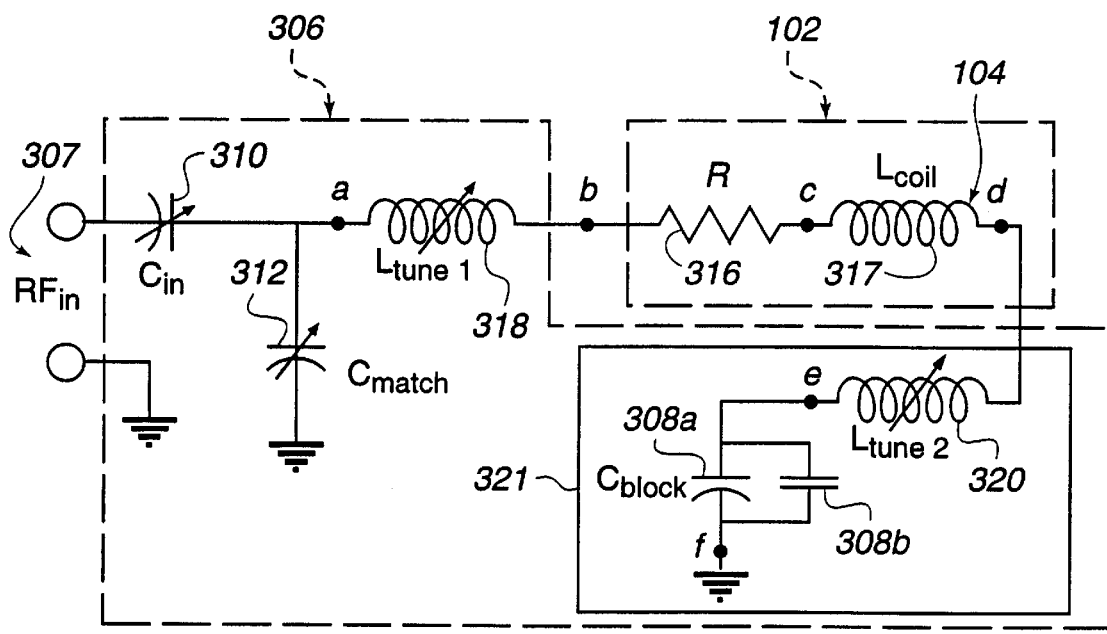
FIG. 3 is a schematic diagram according to one embodiment of the impedance-matching network and the plasma generating chamber of FIG. 2.

FIG. 3 is a schematic diagram illustrating one embodiment of an impedance-matching network 306 having an input capacitor 310 with a variable capacitance $C_{in}$, a parallel match capacitor 312 with a variable capacitance $C_{match}$ and a series tunable inductor 318 with a tunable inductance $L_{tune1}$ coupled through the vacuum chamber 102 to one end of the coil 104. Also, the network includes a blocking impedance 321 coupled through the vacuum chamber 102 to the other end of the coil 104. The blocking impedance 321 comprises a series tunable inductor 320 with a tunable inductance $L_{tune2}$, and a pair of parallel blocking capacitors 308a and 308b with a combined capacitance $C_{block}$. The coil 104 has an associated inductance $L_{coil}$ and a resistance R as shown by an equivalent resistor 316 and inductor 317. The input of the impedance-matching network 306 is coupled to the RF generator 300 through RF input 307.

In accordance with another aspect of the present invention, the impedance values of the tunable inductors 318, 320 may be repeatedly changed in a complementary fashion by rotating cores of the inductors during the deposition so as to shift the distribution of voltages around the coil 104 while maintaining a relatively constant combined impedance to facilitate good impedance matching. One function of the network 306 is to match the impedance of the coil 104 combined with that of the network 306 to the impedance of the RF generator 300 to minimize the reflection of RF energy back to the generator to maximize the coupling of RF energy from the coil 104 to the plasma in the chamber. Accordingly, for a particular coil impedance $L_{coil}$ of the coil 104, the values of the input capacitor 310, match capacitor 312, the tunable inductors 318, 320 and blocking capacitor 308, are chosen to provide a close match to the RF generator impedance which may be 50 ohms, for example. In a manner similar to that of prior impedance matching circuits, the impedances of the input capacitor $C_{in}$, and match capacitor $C_{in}$ may be finely tuned both prior to deposition and also during deposition to achieve and maintain a more precise match by adjusting the variable capacitances of the input capacitor 310 and match capacitor 312.

The blocking capacitors 308a, 308b, like that of blocking capacitors of prior impedance matching circuits, provide an RF return path while isolating the expected DC bias on the coil from ground. The impedance value of the tunable inductor 320 is selected to provide a particular RF distribution so that the coil 104 develops a desired DC bias. However, in accordance with one aspect of the present invention, the impedance value of the tunable inductor 320 may nonetheless be changed in repeating cycles during the deposition by rotating the core of the inductor 320 so as to cyclicly shift the distribution of voltages around the coil 104 so as to increase the uniformity of sputtering rate and coil heating for each portion of the coil 104. To compensate for each change in the inductance of the inductor 320, the core of the inductor 318 is rotated so that the sum of the inductances of the inductors 318 and 320 remains substantially constant. As a consequence, the total impedance of the matching circuit 306 remains substantially constant to facilitate good impedance matching with the RF generator.

This may be understood from the following: The effective potential difference $V_{eff}$ between any two points of the alternating current (AC) series circuit from point a to point e in FIG. 3 equals the product of the effective current $I_{eff}$ and impedance Z of the AC circuit between the respective points. The effective potential difference $V_{ab}$ between points a and b series tunable inductor 318 with a tunable inductance $L_{tune1}$ is given by $$V_{ab} = IZ_{ab}$$

where the impedance $Z_{ab}$ across series tunable inductor 318 with a tunable inductance $L_{tune1}$ is given by $$Z_{ab} = \sqrt{R_{ab}^2 + X_{ab}^2} = X_{L_{tune1}} = \omega L_{tune1}$$

and the phase angle $\Phi_{ab}$ between the instantaneous potential difference $v_{ab}$ and the instantaneous current i across series tunable inductor 318 with a tunable inductance $L_{tune1}$ is given by $$\phi_{ab} = \tan^{-1}\left(\frac{X_{ab}}{R_{ab}}\right) = \tan^{-1}\left(\frac{\omega L_{tune1}}{0}\right) = \tan^{-1}(+\infty) = +\frac{\pi}{2}$$

so that the instantaneous potential difference $v_{ab}$ across series tunable inductor 318 leads the instantaneous current i in the series tunable inductor 318 by 90° and the effective potential difference $V_{ab}$ is equal to $I\omega L_{tune1}$ between points a and b across tunable inductor 318.

The effective potential difference $V_{bc}$ between points b and c across series resistor 316 with an effective resistance R is given by $$V_{bc} = IR$$

The effective potential difference $V_{cd}$ between points c and d across coil 104 with an inductance $L_{coil}$ is given by $$V_{cd} = IZ_{cd}$$

where the impedance $Z_{cd}$ across coil 104 with an inductance $L_{coil}$ is given by $$Z_{cd} = \sqrt{R_{cd}^2 + X_{cd}^2} = X_{L_{coil}} = \omega L_{coil}$$

where the phase angle $\Phi_{cd}$ between the instantaneous potential difference $v_{cd}$ and the instantaneous current i across coil 104 with an inductance $L_{coil}$ is given by $$\phi_{cd} = \tan^{-1}\left(\frac{X_{cd}}{R_{cd}}\right) = \tan^{-1}\left(\frac{\omega L_{coil}}{0}\right) = \tan^{-1}(+\infty) = +\frac{\pi}{2}$$

so that the instantaneous potential difference $v_{cd}$ across coil 104 leads the instantaneous current i in the series inductor by 90° and the effective potential difference $V_{cd}$ is equal to $I\omega L_{coil}$ between points c and d across coil 104.

The effective potential difference $V_{de}$ between points d and e across series tunable inductor 320 with a tunable inductance $L_{tune2}$ is given by $$V_{de} = IZ_{de}$$

where the impedance $Z_{de}$ across series tunable inductor 320 with a tunable inductance $L_{tune2}$ is given by $$Z_{de} = \sqrt{R_{de}^2 + X_{de}^2} = X_{L_{tune2}} = \omega L_{tune2}$$

and the phase angle $\Phi_{de}$ between the instantaneous potential difference $v_{de}$ and the instantaneous current i across series tunable inductor 320 with a tunable inductance $L_{tune2}$ is given by $$\phi_{de} = \tan^{-1}\left(\frac{X_{de}}{R_{de}}\right) = \tan^{-1}\left(\frac{\omega L_{tune2}}{0}\right) = \tan^{-1}(+\infty) = +\frac{\pi}{2}$$

so that the instantaneous potential difference $v_{de}$ across series tunable inductor 320 leads the instantaneous current i in the series tunable inductor 320 by 90° and the effective potential difference $V_{de}$ is equal to $I\omega L_{tune}$ between points d and e across tunable inductor 320.

The effective potential difference $V_{ef}$ between points e and f across blocking capacitors 308a, 308b with a fixed combined capacitance $C_{block}$ is given by $$V_{ef} = IZ_{ef}$$

where the impedance $Z_{ef}$ across blocking capacitors 308a, 308b with a capacitance $C_{block}$ is given by $$Z_{ef} = \sqrt{R_{ef}^2 + X_{ef}^2} = X_{C_{block}} = \frac{1}{\omega C_{block}}$$

and the phase angle $\Phi_{ef}$ between the instantaneous potential difference $v_{ef}$ and the instantaneous current i across blocking capacitors 308a, 308b with a capacitance $C_{block}$ is given by $$\phi_{ef} = \tan^{-1}\left(\frac{X_{ef}}{R_{ef}}\right) = \tan^{-1}\left(\frac{-\frac{1}{\omega C_{block}}}{0}\right) = \tan^{-1}(-\infty) = -\frac{\pi}{2}$$

so that the instantaneous potential difference $v_{ef}$ across blocking capacitors 308a, 308b lags the instantaneous current i in the blocking capacitor 308a by 90° and the effective potential difference $V_{ef}$ is equal to $I(\omega C_{block})^{-1}$ between points e and f across blocking capacitor 308a.

For a given angular frequency $\omega$, the series tunable inductor 320 may be chosen to have a tunable inductance $L_{tune2}$ so that the effective potential difference $V_{de} = I\omega L_{tune2}$ between points d and e across tunable inductor 320 is substantially equal to the difference between the effective potential difference $V_{ef} = I(\omega C_{block})^{-1}$ between points e and f across blocking capacitors 308a, 308b and the effective potential difference $V_{cd} = I\Phi L_{coil}$ between points c and d across coil 104, so that $V_{de} = I\Phi L_{tune2} = V_{ef} - V_{cd} = I(\omega C_{block})^{-1} - I\omega L_{coil}$. The instantaneous potential difference $v_{ef}$ across blocking capacitors 308a, 308b would then lag both the instantaneous potential difference $v_{cd}$ across coil 104 and the instantaneous potential difference $v_{de}$ across series tunable inductor 320 by 180° and the instantaneous potential difference $v_{ef}$ across blocking variable capacitors 308a, 308b consequently would be completely out of phase with both the instantaneous potential difference $v_{cd}$ across coil 104 and the instantaneous potential difference $v_{de}$ across series tunable inductor 320. Ignoring any DC offset bias or a DC self-bias, the effective potential V vanishes (V=0) at point c so that a voltmeter (not shown) between point c and point f would read zero.

Similarly, the series tunable inductor 320 may be chosen to have a tunable inductance $L_{tune2}$ so that the effective potential difference $V_{de} = I\omega L_{tune2}$ between points d and e across tunable inductor 320 is substantially equal to the difference between $(n-1)^{-1}n$ times the effective potential difference $V_{ef} = I(\omega C_{block})^{-1}$ between points e and f across blocking capacitors 308a, 308b and the effective potential difference $V_{cd} = I\omega L_{coil}$ between points c and d across coil 104, so that $$V_{de} = I\omega L_{tune2} = (n-1)^{-1} n V_{ef} - V_{cd} = (n-1)^{-1} n I(\omega C_{block})^{-1} - I\omega L_{coil},$$

where n is any positive real number. The instantaneous potential difference $v_{ef}$ across blocking capacitors 308a, 308b would then lag both the instantaneous potential difference $v_{cd}$ across coil 104 and the instantaneous potential difference $v_{de}$ across series tunable inductor 320 by 180° and the instantaneous potential difference $v_{de}$ across blocking variable capacitors 308a, 308b consequently would be completely out of phase with both the instantaneous potential difference $v_{cd}$ across coil 104 and the instantaneous potential difference $v_{de}$ across series tunable inductor 320. Again, ignoring any DC offset bias or a DC self-bias, the effective potential V vanishes (V=0) at a point along the coil 104 substantially $n^{-1}$ of the way between point c and point e so that a voltmeter (not shown) between the point (substantially $n^{-1}$ of the way between point c and point e) and point f would read zero. In the limit that n becomes very large, the point where the effective potential V vanishes (V=0) along the coil 104 approaches arbitrarily close to point c.

Thus, the tunable inductance $L_{tune2}$ of the series tunable inductor 320 may be chosen so that the effective potential V may be made to vanish (V=0) at substantially any point along the coil 104 between point c and point d. This ability to vary over time the point along the coil 104 at which the effective potential V vanishes (V=0) may be used to shift the RF voltage distributions along the coil 104, and to shift the ionization pattern associated with a particular voltage distribution. As a consequence, the coil 104 and substrate 112 can be more uniformly and axially symmetrically heated, and the material sputtered more uniformly from the coil 104, by time-averaging.

Figure 4:
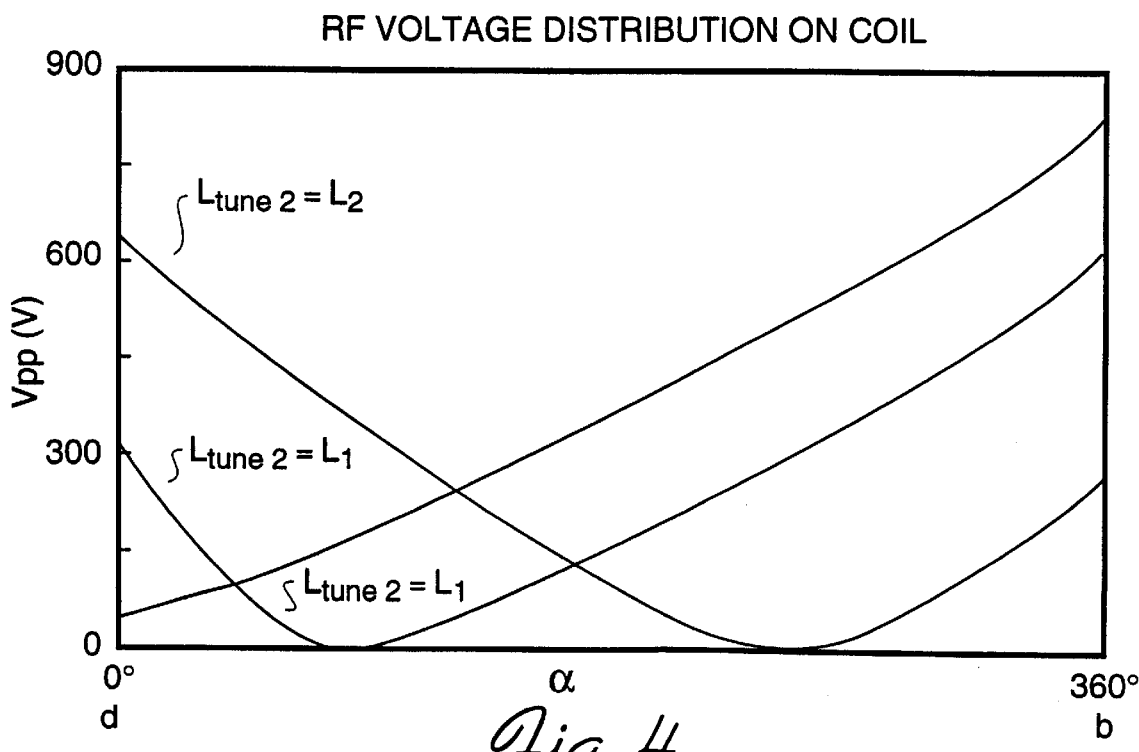
FIG. 4 is a graph depicting shifts in RF voltage distribution along a coil as a function of blocking impedance change.

FIG. 4 is a graph depicting one example of how the RF voltage distributions might shift along the coil as the impedance of the inductor 320 is changed during deposition. In FIG. 4, the distributions of peak to peak RF voltage $V_{pp}$ on the coil 104 are shown as a function of position on the one turn coil 104 represented by coil angle α (FIG. 2) in which coil angle α=0° corresponds to end d (FIG. 3) of the coil and coil angle α=360° corresponds to end b of the coil 104 at which the RF feedthroughs are coupled to the coil.

In one distribution, when the inductance of the inductor 320 has a value of $L_1$ μH, the peak to peak RF voltage $V_{pp}$ at end α=0° may start at 300 volts and may decrease to 0 volts at approximately coil location α=90°. The RF voltage would then increase at succeeding locations around the coil until the other end b of the coil (α=360°) is reached where the peak to peak RF voltage may have a value of approximately 600 volts, for example. Because the peak to peak voltage is greatest at the coil location corresponding to coil angle α=360°, a hot spot may develop at that point in the example. However, if in accordance with the present invention, the inductance of the inductor 320 is changed to another value while the deposition is proceeding, the hot spot may be shifted.

Thus, if the inductance of the inductor 320 is changed to $L_2$, for example, the voltage distribution will shift in this example so that the distribution is effectively reversed as shown. More specifically, at this inductance, the peak to peak RF voltage $V_{pp}$ at end α=0° may start somewhat above 600 volts and may continuously decrease at succeeding locations around the coil until coil location α≈240° is reached where $V_{pp}$ could equal 0 volts. The RF voltage would then increase until the other end b of the coil (α=360°) is reached where the peak to peak RF voltage may have a value of approximately 300 volts. Accordingly, the hot spot would shift to the other end of the coil at coil angle α=0°. By appropriately changing the impedance of the inductor 320 as the deposition proceeds, the hot spot may be shifted to intermediate positions along the coil circumference to more evenly distribute the hot spots and thus more evenly heat and sputter the coil.

As the voltage distribution is shifted, the maximum and minimum values along the coil can change as well. Thus, as shown in FIG. 4, if the inductance of the inductor 320 is changed to $L_3$, for example, the voltage distribution will shift in this example so that the peak to peak RF voltage $V_{pp}$ at end α=0° may start at close to 0 volts and may continuously increase until the other end b of the coil (α=360°) is reached where the peak to peak RF voltage has a value of approximately 800 volts, for example. Accordingly, the maximum and minimum values of the voltage distribution may change as well as the locations of the maximum and minimum values as the impedance is changed as the deposition progresses to more evenly heat and sputter the coil.

In addition, the two series tunable inductors 318 and 320 may be tuned substantially simultaneously in a complementary fashion so that the sum of the tunable inductances ($L_{tune1}$+$L_{tune2}$) remains substantially constant. Such an arrangement can reduce or eliminate the need for rematching the impedances of the coil 104, the blocking impedance 321 and the matching network 306*a* as the impedance of the tunable inductor 320 is varied to rotate the voltage distribution along the coil 104. As shown in FIG. 3, the matching capacitor 312 and the input capacitor 310 of the matching network 306*a* are coupled to an impedance which is the impedance of the series coupled components from point a to point f in FIG. 3. This impedance, which may be represented as the impedance $Z_{af}$ is defined by the impedances of these components, including the coil 104, as set forth below:

$$Z_{af} = \sqrt{R^2 + \left((\omega L_{tune1} + \omega L_{coil} + \omega L_{tune2}) - \frac{1}{\omega C_{block}}\right)^2}$$

It is seen that if the impedances of the coil 104 (i.e., $(R^2+(\omega L_{coil})^2)^{1/2}$) and the blocking capacitors 308*a*, 308*b* (i.e., $1/(\omega C_{block})$) are fixed, and the sum of the impedances of the tunable inductances 318 and 320 (i.e., $\omega L_{tune1}$+$\omega L_{tune2}$) is also constant, that the impedance $Z_{af}$ of the series coupled components from point a to point f in FIG. 3 will be constant even though the impedance $\omega L_{tune2}$ of the tunable inductor 320 can be repeatedly changed to rotate the voltage distribution along the coil 104. Indeed, the change of the impedance $Z_{af}$ with time is believed to be given by:

$$\frac{dZ_{af}}{dt} = \frac{\left((\omega L_{tune1} + \omega L_{coil} + \omega L_{tune2}) - \frac{1}{\omega C_{block}}\right)\left(\frac{d(\omega L_{tune1})}{dt} + \frac{d(\omega L_{tune2})}{dt}\right)}{\sqrt{R^2 + \left((\omega L_{tune1} + \omega L_{coil} + \omega L_{tune2}) - \frac{1}{\omega C_{block}}\right)^2}}$$

using the fixed impedances of the coil 104 and the blocking capacitors 308*a*, 308*b*, which shows that the impedance $Z_{af}$ is constant provided that the sum of the impedances of the tunable inductances 318 and 320 (i.e., $\omega L_{tune1}$+$\omega L_{tune2}$) is constant. It is believed that when the resistance R of the coil 104 is negligible in comparison to the reactance (i.e., $R \ll \omega L_{tune1}+\omega L_{coil}+\omega L_{tune2}-1/(\omega C_{block})$), then the impedance $Z_{af}$ is approximately:

$$Z_{af} \approx (\omega L_{tune1} + \omega L_{coil} + \omega L_{tune2}) - \frac{1}{\omega C_{block}}$$

so that the change of the impedance $Z_{af}$ with time is approximately:

$$\frac{dZ_{af}}{dt} \approx \frac{d(\omega L_{tune1})}{dt} + \frac{d(\omega L_{tune2})}{dt}$$

which again substantially vanishes as long as the sum of the impedances of the tunable inductances 318 and 320 (i.e., $\omega L_{tune1}$+$\omega L_{tune2}$) is substantially constant.

Consequently, the impedances of the input capacitor 310, the matching capacitor 312 or the blocking capacitor 308*a* need not be adjusted to maintain an impedance match with the generator 300 as a result of changes to the tunable inductor 320. Instead, adjustments to the input capacitor 310 and/or the matching capacitor 312 may be limited to those normally encountered as a result of the usual variations in the effective inductance of the coil 104 caused by changes to the plasma and other causes during an ongoing deposition. Such an arrangement can reduce or eliminate the need for rematching the impedances of the coil 104 and the impedance-matching network 306a to the RF generator 300 as the impedance of the tunable induction 320 is varied to rotate the voltage distribution along the coil 104.

A typical time constant for rematching the impedance of the coil 104 using typical impedance-matching networks is on the order of a few seconds for frequency auto-tuning and more than a few seconds for mechanical auto-tuning. During the rematching time period, the RF power to the plasma may be effectively shut off due to RF power reflection caused by the impedances of the coil 104 and the blocking capacitor not being sufficiently well-matched to that of the generator. Also, the time needed for rematching may be too long for relatively short deposition processes such as those lasting only tens of seconds.

In the embodiment of FIG. 3, by keeping the sum of the tunable inductances ($L_{tune1}+L_{tune2}$) substantially constant, a change in the blocking impedance of the blocking circuit 321 (by varying the inductance of the tunable inductor 320) to rotate the voltage distribution along the coil does not cause the circuit to lose its match to the generator. Consequently, the embodiment of FIG. 3 is well suited to those applications which require the maintenance of a good impedance match to prevent undue reflection of the RF energy from the generator. Thus, the embodiment of FIG. 3 may readily utilize impedance-matching maintenance by frequency auto-tuning or mechanical autotuning as well as for any other known matching techniques.

Figure 5:
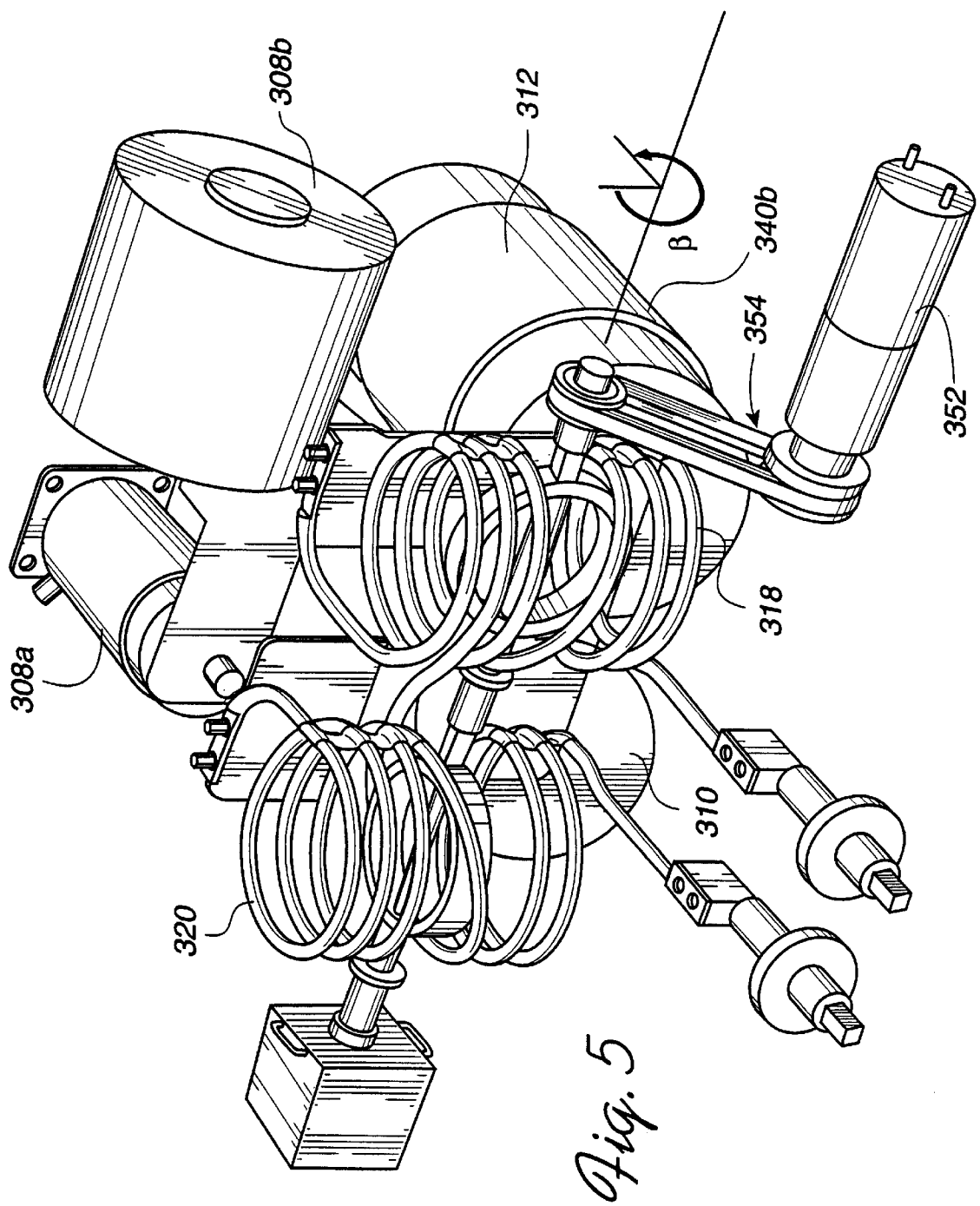
FIG. 5 is a perspective schematic view of an impedance-matching network having a pair of tunable inductors in accordance with an embodiment of the present invention.
Figure 6:
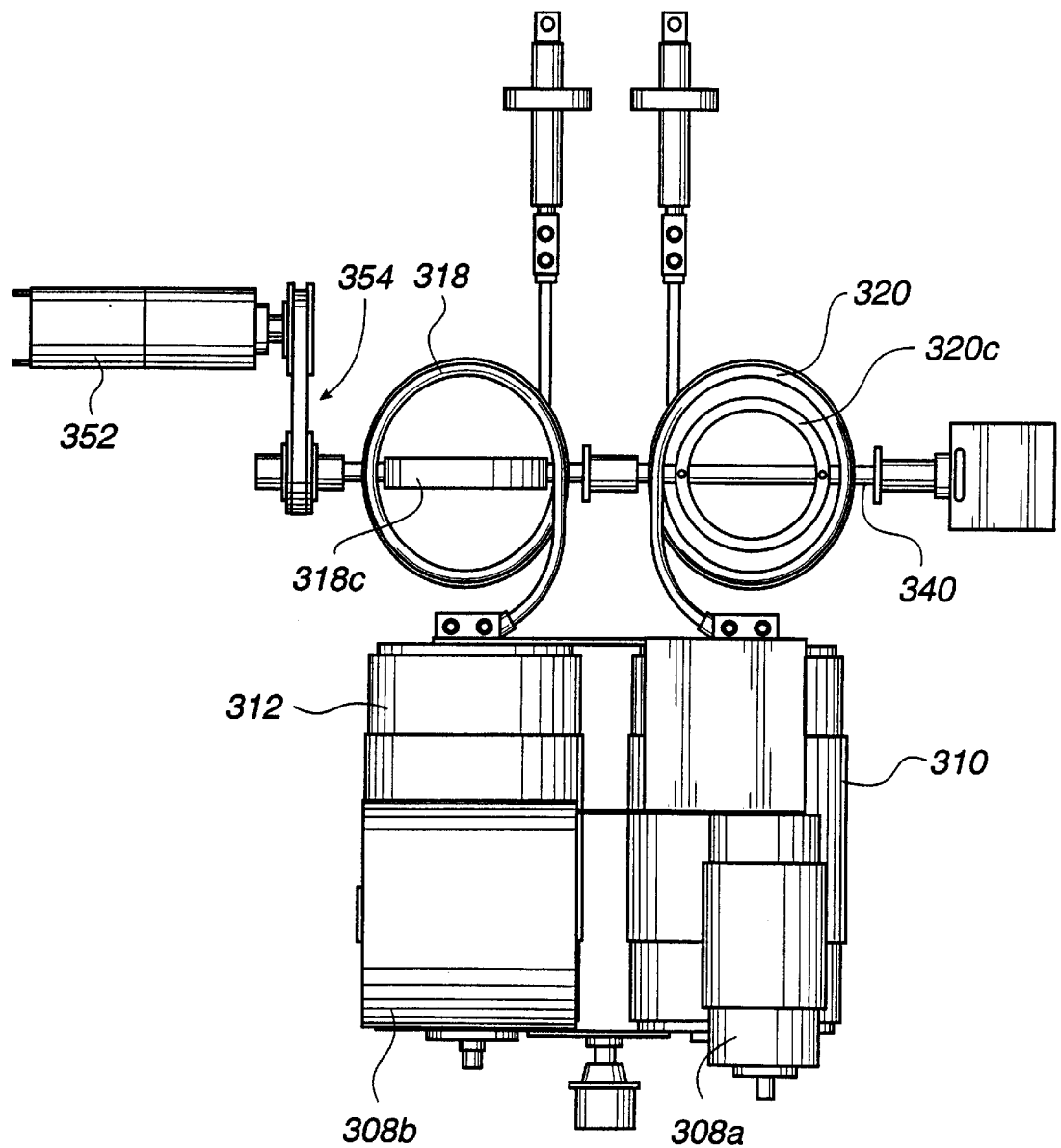
FIG. 6 is a top view of the impedance-matching network of FIG. 5.

The sum of tunable impedances such as the inductances ($L_{tune1}+L_{tune2}$) of the inductors 318 and 320 may be kept substantially constant in a variety of different arrangements. For example, FIG. 5 illustrates an embodiment having two tunable inductors 318 and 320 in which the sum of the associated tunable inductances ($L_{tune1}+L_{tune2}$) remains substantially constant by mechanically coupling the rotating cores of the tunable inductors 318 and 320 together. As shown in FIGS. 5 and 6, two substantially identical rotatable annular ring-shaped core pieces 318c and 320c, are disposed inside the coils 318 and 320, respectively, and are connected by a substantially rigid, and substantially electrically insulating common rotating shaft 340. Because the core pieces 318c and 320c are mechanically linked together by the common shaft 340, core pieces 318c and 320c rotate in unison within their respective coils 318 and 320, as indicated by the arrow A in FIG. 5. This coupled movement of the core pieces 318c and 320c substantially tunes the respective inductances $L_{tune1}$ and $L_{tune2}$ of the series tunable inductors 318 and 320 substantially simultaneously.

The core pieces 318c and 320c may be made of a variety of materials including conductive materials such as copper or ferromagnetic materials such as soft magnetic core materials or other materials such as stainless steel. Thus, if core piece 320c is made of copper, for example, the conductive property of the core piece 320c decreases the inductance $L_{tune2}$ of coil 320. This decrease is at a maximum (corresponding to the minium coil inductance) when core piece 320c is rotated to a position disposed substantially at the center of coil 320 with the central axis symmetry of the annular ring-shaped coil piece 320c aligned substantially coaxial with the central axis of the coil inductor 320 as shown in FIGS. 5 and 6. In this position the core piece 320c acts as a single turn short which in effect shorts magnetic flux to decrease the inductance of the coil 320.

Figure 7:
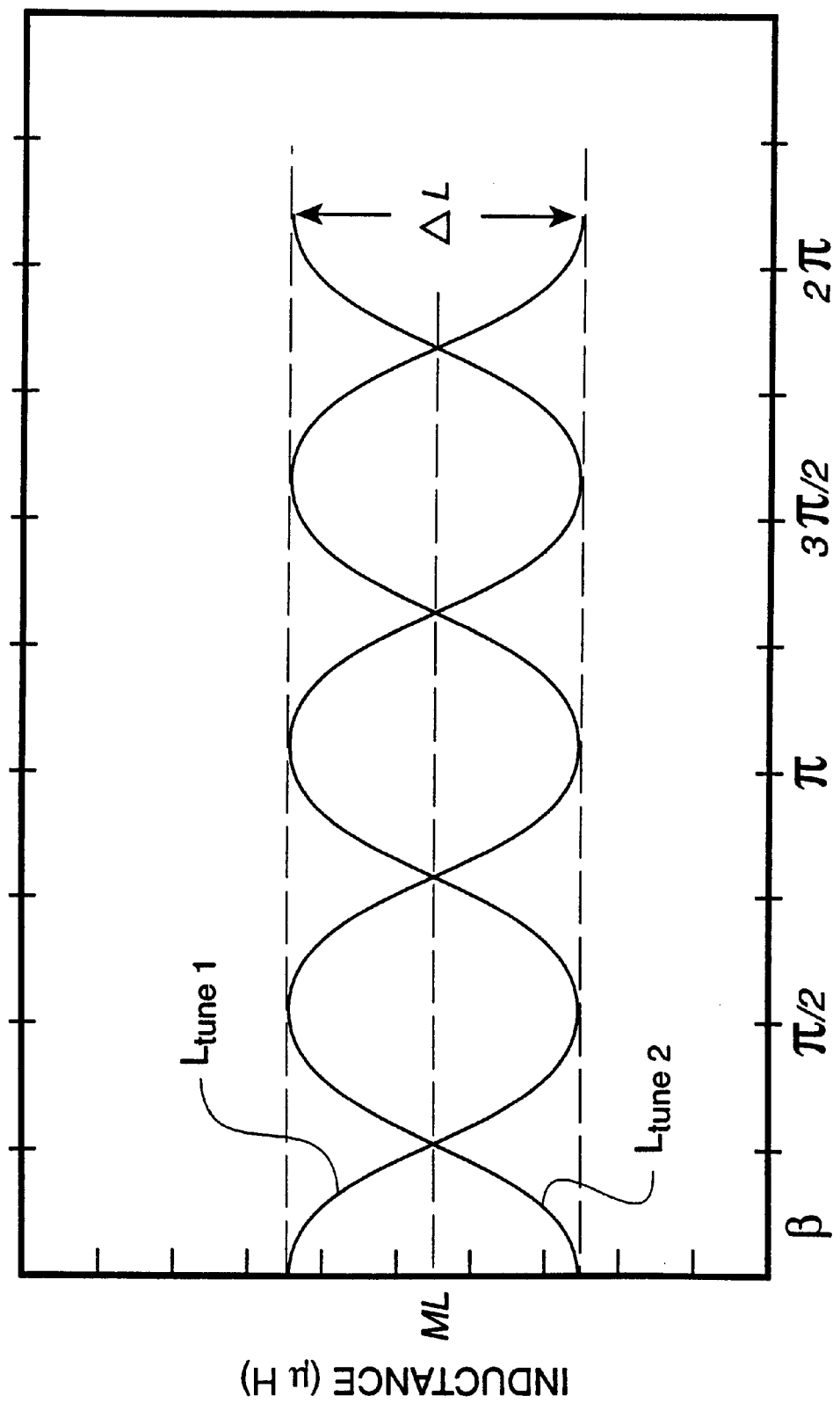
FIG. 7 is a graph illustrating induction values as a function of core piece angle for the impedance-matching network of FIG. 5.

The angular position of the core pieces 318c and 320c are represented as as the angle "β" in FIG. 5. The changes in inductances of the coils 318 and 320 as a function of angular position β of their respective core pieces 318c and 320c is illustrated in FIG. 7. When β=0, the core piece 320c is coaxially aligned with the coil 320 as shown in FIGS. 5 and 6. At this position, the inductance $L_{tune2}$ of coil 320 is at a minimum as shown in FIG. 7. As the angular position β increases during a quarter turn of the core piece 320c, the inductance $L_{tune2}$ of coil 320 increases. Once the core piece 320 is rotated to a position in which the central axis of the core piece 320c is orthogonal to the central axis of the coil 320 (β=π/2), the inductance $L_{tune2}$ of coil 320 reaches a maximum because the shorting effect of the core piece $320_c$ is at a minimum.

During the next quarter turn of the core piece 320c, the inductance $L_{tune2}$ of coil 320 decreases until it reaches the minimum (at β=π) when the core piece central axis is again aligned with the coil central axis. During the third quarter turn, the inductance $L_{tune2}$ of coil 320 again increases until it reaches the maximum when the central axis of the core piece 320c is orthogonal to the central axis of the coil 320 (at β=3π/2). During the fourth quarter turn of the core piece 320c, the inductance $L_{tune2}$ of coil 320 decreases until it reaches the minimum (at β=2π or 0) when the central axis is again aligned with the coil central axis. Thus, for each full rotation of the core piece 320c, the inductance of the coil 320 changes through 2 full cycles.

The inductance of the other coil 318 changes in a similar manner as the coil piece 318c rotates. However, the core piece 318c is mounted on the common shaft 340 in a position which is orthogonal to that of the core piece 320c of the coil 320 as shown in FIGS. 5 and 6. Consequently, when the central axis of the core piece 320c is aligned with the central axis of the coil 320, the central axis of the core piece 318c is orthogonal to the central axis of the coil 318. Conversely, when the central axis of the core piece 320c is orthogonal to the central axis of the central axis of the coil 320, the central axis of the core piece 318c is orthogonal to the central axis of the coil 318. Consequently, the change in inductance in the coil 320 is 180° out of phase with the change in inductance. In other words, when the inductance of the coil 320 is at a maximum, the inductance of the coil 318 is at a minimum and vice-versa. The magnitude of the change in the inductance in each coil may then be selected so that a decrease or increase of inductance in one coil can effectively compensate a corresponding increase or decrease in the inductance of the other coil such that the total inductance of the coils 318 and 320 remains substantially constant notwithstanding constant variation in the inductances of the coils 318 and 320, individually. As a result, maintaining a good match with the RF generator is facilitated.

As shown in FIG. 7, it is believed that the change of inductance in each coil is substantially sinusoidal as a function of the angular position β of the coil core piece. The vertical scale in FIG. 7 is measured in microHenrys (μH). It is believed that the magnitude of the change in the inductance $L_{tune1}$ of coil 318 shown in FIG. 6, of about 0.6 μH (which in the illustrated embodiment is about 25% of the average inductance of the coil 318), is sufficient for many applications to rotate the RF voltage distributions along the entire length of the one turn coil 104, and to rotate ionization pattern associated with the RF voltage distribution. The amount of impedance change required to rotate the voltage distribution will depend upon a number of factors including the number of turns of the sputtering coil 104 and in some applications the diameter of the coil 104.

In the illustrated embodiment, it is preferred that the midpoint value $M_L$ of the variable inductance $L_{tune1}$ of coil 318 be selected so that the RF voltage null point is located approximately midpoint (indicated at $M_C$ in FIG. 8) on the coil 104 between the two ends b, d of the coil 104 when inductance of the coil 318 is at the midpoint value $M_L$. It is further preferred that the total change $\Delta L$ in the inductance $L_{tune1}$ of coil 318 be sufficient to sweep the RF voltage null point beyond the ends b, d of the coil 104. Such an arrangement is believed to cause the dwell time of the RF null point at coil locations adjacent to the ends b, d of the coil 104 to conform more closely to the dwell time of the RF null point at coil locations adjacent the coil midpoint $M_C$. As a result, it is believed that the time averaged RF voltage distribution can be made more uniform over the entire length of the coil, including the ends of the coil. In many applications, it is believed that sweeping the null point beyond the ends a distance equal to approximately 5 to 30% of the coil length may provide satisfactory results.

It is contemplated that impedance changes having a lower maximum change may be used to achieve beneficial RF voltage and plasma ionization rotations or other movements. For example, an impedance change which varies between 0 and 0.1 $\mu H$ may provide beneficial shifts. On the other hand, impedance changes having a maximum change substantially greater than 0.6 $\mu$Henries, including 1.5 $\mu H$ and more may also be beneficial to improve uniformity. Also, it is believed that a variable impedance such as an inductor having a rotating core which changes the inductor impedance a maximum of 0.6 $\mu H$ as described above is sufficient to shift the voltage distribution a full 360° around the circumference of the coil each half cycle of the core movement plus an additional approximately 20% beyond the coil ends b, d. Voltage distribution shifts over smaller portions of the coil circumference such as 270°, 180°, 90° 45°, 30°, 15° and smaller may also be beneficial. Likewise, voltage distribution shifts on multi-turn coils which lap the coil circumference in whole or in part shifting the voltage distribution around more than one turn each cycle or half cycle of the impedance change are also believed to be beneficial. Accordingly, the voltage distribution may shift an angular distance which is in excess of 360° each half cycle of the core's movement.

As set forth above, the core pieces 318c and 320c are coupled together by the rotating shaft 340. As a result, an increase in the alignment between the axial alignment of the center of coil 318 and the center axis of the core piece 318, causes a corresponding decrease in the alignment between the axial alignment of the center of coil 320 and the center axis of the core piece 320c. In this rotation system, the inductances $L_{tune1}$ and $L_{tune2}$ of the coils 318 and 320, respectively, change substantially sinusoidally, and substantially oppositely, with changes in the axial alignment between the centers of coils 318 and 320 and the center axes of respective core pieces 318c and 320c. Thus, an increase in the inductance $L_{tune1}$ of the coil 318 can be substantially compensated by a corresponding substantially equal decrease in the inductance $L_{tune2}$ of the coil 320. Conversely, a decrease in the inductance $L_{tune1}$ of the coil 318 is substantially compensated by a corresponding substantially equal increase in the inductance $L_{tune2}$ of the coil 320. The sum of the tunable inductances ($L_{tune1}+L_{tune2}$) thus remains substantially constant by coupling the two series tunable inductors 318 and 320 together as shown in FIG. 5. It is believed that no rematching of the impedance of the coil 104 with the RF generator 300 is needed, even though the individual inductances $L_{tune1}$ and $L_{tune2}$ of the coils 318 and 320 each change, since the sum of the tunable inductances ($L_{tune1}+L_{tune2}$) thus remains substantially constant as set forth above.

Thus, by cyclicly rotating the coupled core pieces 318c and 320c within their respective coils 318 and 320b, the inductances of the inductors 318 and 320 may be continuously and cyclicly varied in such a manner as to shift the coil voltage distributions back and forth through all or substantially all points along the circumference of the coil 104 in repeating cycles as the deposition progresses. Moreover, because the sum of the inductances of the coils 318 and 320 remain substantially constant as the individual inductances of the coils 318 and 320 are varied, it is believed that the need for impedance rematching as a consequence of the impedance variation is substantially obviated.

The core pieces 318c and 320c may be rotatably actuated by a motor 352 (FIGS. 5 and 6) coupled by a belt and pulley transmission 354 to the rotatable shaft 340, or by any other suitable rotation actuator or driver. In one alternative embodiment, each core piece may be actuated individually by a separate programmable stepper motor. Such an arrangement may provide further flexibility in varying the inductances of the coils to improve, for example, the uniformity of the combined inductances or to achieve other effects.

As noted above, the shaft 340 is preferably made of a dielectric material. Because the shaft 340 is disposed substantially inside the coils 318 and 320 which can generate substantial heat, the shaft 340 may be made heat resistant, by forming the shaft of a heat resistant material such as a ceramic, for example. The shaft 340 may also be water cooled.

FIG. 9 shows a rotatable core piece 400 in accordance with an alternative embodiment which is similar to the core pieces 318c and 320c of FIG. 5. However, instead of a single ring of conductive material, the core piece 400 of FIG. 9 has a plurality of rings 402 of conductive material mounted on a common shaft 404. The rings 402 are preferably positioned in a common plane and concentric. In the illustrated embodiment, the rings 402 are carried by an insulative shaft 404. It is believed that the core piece 400 when rotated within a coil by the shaft 404 can induce a larger change in the inductance of the coil as a result of the added number of rings such as three rings in the illustrated embodiment.

FIGS. 10a and 10b illustrate a rotatable core piece 450 in accordance with yet another embodiment. The core piece 450 comprises a closed loop conductor which is spiral wound in a generally spherical shape with an inner axial portion 452 electrically coupling the conductor at the two "poles" of the core piece. The core piece 450 is supported for rotation by an insulative shaft 454 which is orthogonally coupled to the inner portion 452 as shown. In a manner similar to that of the ring-shaped core pieces illustrated in FIGS. 5 and 9, the spiral wound core piece of FIGS. 10a and 10b "shorts" the magnetic flux of the coil when the inner axial portion 452 of the core piece 450 is positioned coaxial to the coil central axis. Conversely, the coil inductance is at a maximum when the inner axial portion 452 of the core piece 450 is rotated to a position orthogonal with the coil central axis.

Figure 11A:
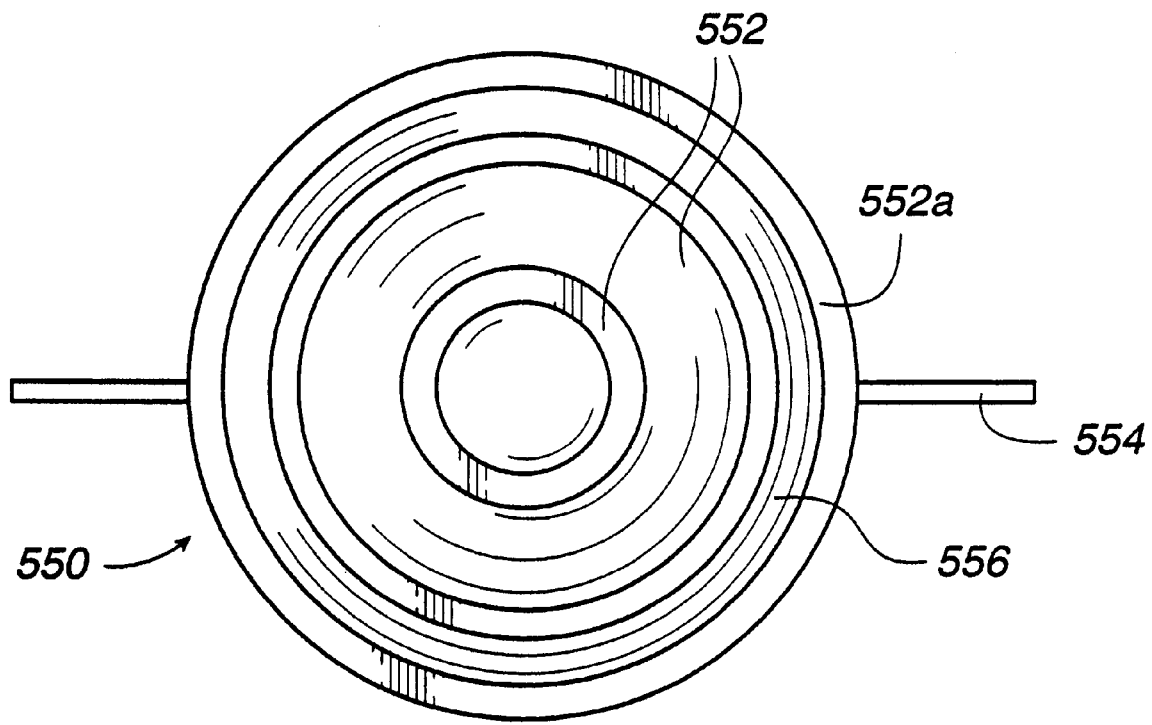
FIGS. 11A and 11B are schematic top and side views, respectively, of a rotatable core piece for a tunable inductor coil in accordance with still another embodiment of the present invention.
Figure 11B:
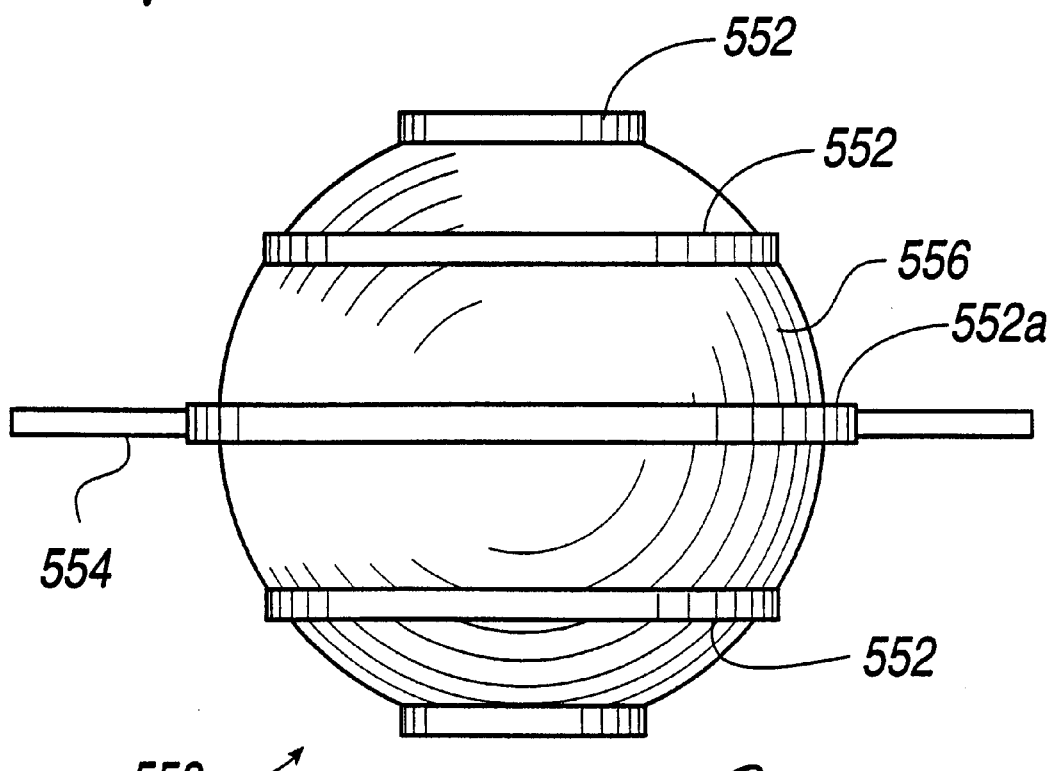

FIGS. 11a and 11b illustrate a rotatable core piece 550 in accordance with yet another embodiment. The core piece 550 comprises a plurality of ring-shaped closed loop conductors 552 of varying diameter which, like the ring-shaped conductors of FIG. 9, are positioned concentrically on a common axis. However, the conductors are not in a common plane but are instead spaced so as to form a generally spherical shape. The core piece 550 is supported for rotation by an insulative shaft 554 which is orthogonally coupled to the central ring-shaped conductor 552a as shown. The conductors 552 may be supported by a ring or ball 556 made of an insulative, heat resistant material such as ceramic. The conductors 552 may be separate members affixed to the ball 556 or formed by "painting" a conductive material onto the the ball 556.

In a manner similar to that of the ring-shaped core pieces illustrated in FIGS. 5 and 9, the ring-shaped conductors of FIGS. 11a and 11b "short" the magnetic flux of the coil when the central axis of the conductors 552 is coaxially aligned with the coil central axis. Conversely, the coil inductance is at a maximum when the central axis of the conductors 552 is rotated to a position orthogonal to the coil central axis. Although spherical shapes are illustrated for the embodiments of FIGS. 10–11, it is appreciated that a core piece comprising a closed loop conductor may have a variety of other shapes including cylindrical and disk-shaped. In addition, non-symmetrical shapes may be utilized as well.

The core pieces may be made of a ferromagnetic material such as iron or stainless steel. A core piece made of such a ferromagnetic material augments or increases the inductance of the coil and such increase is at a maximum when the body of the core piece is shaped longitudinally and positioned along the center axis of the coil. Conversely, when the core piece is rotated out of this alignment, the augmentation is reduced and is at a minimum when the core piece is aligned orthogonal to the core axis. Again, an increase in the inductance $L_{tune1}$ of the coil 318 can be substantially exactly compensated by a corresponding decrease in the inductance $L_{tune2}$ of the coil 320 by coupling the core pieces to rotate in offsetting positions in a manner similar to that described above. The sum of the tunable inductances ($L_{tune1}+L_{tune2}$) thus again can remain substantially constant.

To reduce corrosion, the core pieces are preferably coated with a suitable coating. For example, a copper core may be plated with gold.

The coil 104 is carried on the chamber shield 106 by a plurality of coil standoffs 120 (FIG. 1) which electrically insulate the coil 104 from the supporting chamber shield 106. In addition, the insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield 106. Such a completed conducting path is undesirable because it could short the coil 104 to the chamber shield 106 (which is typically grounded).

RF power is applied to the coil 104 by feedthrough bolts which are supported by insulating feedthrough standoffs 124. The feedthrough standoffs 124, like the coil support standoffs 120, permit repeated deposition of conductive material from the target onto the feedthrough standoff 124 without the formation of a conducting path which could short the coil 104 to the chamber shield 106. The coil feedthrough standoff 124, like the coil support standoff 120, has an internal labyrinth structure to prevent the formation of a short between the coil 104 and the wall of the shield. The feedthrough is coupled to the RF generator 300 (shown schematically in FIG. 2) through the impedance-matching network 306 (also shown schematically in FIG. 2).

As set forth above, the RF power radiated by the coil 104 energizes the plasma in the chamber to ionize the target material being sputtered from the target 1 10. The ionized sputtered target material is in turn attracted to the substrate 112 which is at a negative (DC or RF) potential to attract the ionized deposition material to the substrate 112.

In the illustrated embodiments discussed above, a single turn coil 104 was used, but, of course, multiple turn coils may be used instead. Still further, instead of the ribbon shape coil 104 illustrated, each turn of the coil 104 may be implemented with water cooled tubular helix or spiral shaped coils. Also, a flat, open-ended annular ring may be used as described in copending application Ser. No. 08/680, 335, entitled "Coils for Generating a Plasma and for Sputtering," filed Jul. 10, 1996 (Attorney Docket No. 1390-CIP/PVD/DV) and assigned to the assignee of the present application.

Each of the embodiments discussed above utilized a single coil in the plasma chamber. It should be recognized that the present invention is applicable to plasma chambers having more than one RF powered coil or RF powered shields. For example, the present invention may be applied to multiple coil chambers for launching helicon waves of the type described in aforementioned copending application Ser. No. 08/559,345, filed Nov. 15, 1995 and entitled "Method And Apparatus For Launching a Helicon Wave in a Plasma" (Attorney Docket No. 938).

The appropriate RF generators and matching circuits have components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary. For example, 1 MHz to 20 MHz is believed suitable. An RF power setting of 1.5 kW is preferred but a range of 1.5–5 kW is satisfactory. In addition, a DC power setting for biasing the target 110 of 8–12 kW is preferred but a wider range such as 2–24 kW may also be satisfactory. A pedestal 114 bias voltage of −30 volts DC is also suitable. Values for the above parameters will vary, depending upon the particular application.

A variety of sputtering gases may be utilized to generate the plasma including Ar, and a variety of reactive gases such as $NF_3$, $CF_4$, $H_2$, $O_2$ and many others may be used. Various sputtering gas pressures are suitable including pressures of 0.1–100 mTorr. For ionized PVD, a pressure between 10 and 50 mTorr often provides better ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A semiconductor fabrication system for depositing material onto a substrate, the system comprising:

a semiconductor fabrication chamber having a plasma generation area within said chamber;

a plasma generation coil positioned to couple RF energy into said plasma generation area to generate a plasma, said plasma generation coil having a plurality of voltage values distributed along said plasma generation coil; and a voltage distribution controller having a first variable inductor which has a first variable inductance, said voltage distribution controller being coupled to said plasma generation coil and adapted to shift said voltage value distribution in a predetermined path along said plasma generation coil as a function of said first variable inductance of said first variable inductor wherein said first variable inductor includes a first inductor coil having a central axis and a first rotating core adapted to rotate about a rotational axis which is nonparallel to said first inductor coil central axis to provide said first variable inductance which varies as a function of the position of said first core as said first core rotates.

2. The system of claim 1 wherein said voltage distribution controller includes a second inductor coil having a second rotating core wherein said second inductor coil has a central axis and said second rotating core is adapted to rotate about a rotational axis which is nonparallel to said second inductor coil central axis to provide a second inductance which varies as a function of the position of said second core as said second core rotates.

3. The system of claim 2 wherein said first and second cores are oriented relative to each other so that changes to said first and second inductances caused by rotation of said first and second cores are substantially complementary.

4. The system of claim 2 wherein said first and second cores are oriented orthogonally relative to each other.

5. The system of claim 2 further comprising a rotatably mounted shaft wherein said first and second cores are both carried by said shaft.

6. The system of claim 5 further comprising a motor coupled to said shaft and adapted to rotate said shaft.

7. The system of claim 2 further comprising a first rotation actuator coupled to said first core and adapted to rotate said first core and a second rotation actuator coupled to said second core and adapted to rotate said second core.

8. The system of claim 7 wherein said second actuator provides a predefined rotation of said second core to compensate a first change in said first inductance caused by rotation of said first core of said first inductor coil by said first actuator, with a second change in said second inductance of said second inductor coil so as to keep a sum of said first and second inductances substantially constant.

9. The system of claim 8 wherein said second actuator comprises a programmable stepper motor.

10. The system of claim 2 wherein said second rotating core is mechanically linked to said first rotatable core.

11. The system of claim 1 wherein said first core is substantially ferromagnetic.

12. The system of claim 1 wherein said first core is electrically conductive.

13. The system of claim 12 wherein said first core is formed of copper.

14. The system of claim 1 wherein said rotating core is adapted to cause said first variable inductance to vary sufficient to extend said predetermined path an angular distance of at least 15° along said plasma generation coil.

15. The system of claim 1 wherein said rotating core is adapted to cause said first variable inductance to vary sufficient to extend said predetermined path an angular distance of at least 90° along said plasma generation coil.

16. The system of claim 1 wherein said rotating core is adapted to cause said first variable inductance to vary sufficient to extend said predetermined path an angular distance of at least 180° along said plasma generation coil.

17. The system of claim 1 wherein said rotating core is adapted to cause said first variable inductance to vary sufficient to extend said predetermined path an angular distance of at least 360° along said plasma generation coil.

18. The system of claim 1 further comprising a first rotation actuator coupled to said first core and adapted to rotate said first core sufficiently to cyclicly increase and decrease said first variable inductance wherein said voltage value distribution is shifted back and forth in said predetermined path along said plasma generation coil.

19. The system of claim 18 wherein said voltage value distribution is shifted an angular distance of at least 90° in said predetermined path along said plasma generation coil in a half cycle of said cyclic shifting.

20. The system of claim 1 further comprising a first rotation actuator coupled to said first core and adapted to rotate said first core at least a full rotation to increase and decrease said first variable inductance twice wherein a full rotation of said first core shifts said voltage value distribution back and forth twice in said predetermined path along said plasma generation coil.

21. The system of claim 1 further comprising a target of said material positioned so that at least a portion of material sputtered from said target is ionized by said plasma generated by said plasma generation coil and then deposited onto said substrate.

22. The system of claim 1 wherein said first core is adapted to cause said first variable inductance to vary by at least 0.6 $\mu$Henries as said first core is rotated.

23. A semiconductor fabrication system, comprising:
a semiconductor fabrication chamber having a plasma generation area within said chamber;
a plasma generation coil positioned to couple RF energy into said plasma generation area to maintain a plasma in said plasma generation area, said plasma generation coil having a plurality of voltage values distributed along said coil; and
reactance means coupled to said coil and having a first inductor coil which defines a central axis, and a first rotating core positioned within said inductor coil and adapted to rotate about a rotational axis which is nonparallel to said inductor coil central axis, for shifting said distribution of voltage values in a predetermined path along said plasma generation coil.

24. The system of claim 23 wherein said reactance means cyclicly shifts said voltage distribution along said plasma generation coil.

25. The system of claim 23 further comprising an RF generator and a second inductor coil coupled between said generator and said plasma generation coil.

26. The system of claim 25 wherein said second inductor coil has a second rotating core.

27. The system of claim 26 wherein said first rotating core is mechanically linked to said second rotating core so that movement of said second rotating core is responsive to movement of said first rotating core.

28. The system of claim 27 wherein said reactance means further comprises a motor for rotating said first and second rotating cores in unison.

29. The system of claim 26 wherein said first rotating core is mechanically linked to said second rotating core so that the sum of the inductances of said first and second inductors remains substantially constant during movement of said first and second rotating cores.

30. A semiconductor fabrication system, comprising:
a semiconductor fabrication chamber having a plasma generation area within said chamber;
a plasma generation coil positioned to couple RF energy into said plasma generation area to maintain a plasma in said plasma generation area, said plasma generation coil having a plurality of voltage values distributed along said plasma generation coil;

a first inductor coupled between said plasma generation coil and ground wherein said first inductor includes a first inductor coil having a central axis and a first rotating core adapted to rotate about a rotational axis which is nonparallel to said first inductor coil central axis; and core rotation means for rotating said first inductor core about said core rotation axis and thereby changing the inductance of said first inductor so as to shift said voltage value distribution in a predetermined path along said plasma generation coil.

31. The system of claim 30 for use with a substrate, said system further comprising a deposition material source adapted to provide material to be deposited onto said substrate wherein said core rotation means comprises means for rotating said first core at least one full rotation within said first inductor coil while material is deposited onto said substrate.

32. The system of claim 31 further comprising an RF generator coupled to said plasma generation coil, and a second inductor coil coupled between said generator and said plasma generation coil.

33. The system of claim 32 wherein said second inductor coil has a second rotating core and said core rotation means comprises means for rotating said second core within said second inductor coil.

34. The system of claim 33 wherein core rotation means comprises means for rotating said first core within said first inductor coil simultaneously with rotating said second core within said second inductor coil.

35. The system of claim 33 wherein said core rotation means rotates said first core within said first inductor coil and rotates said second core within said second inductor coil so that the inductances of said first and second inductances are changed complementary one to the other.

36. The system of claim 33 wherein said core rotation means rotates said first core within said first inductor coil and rotates said second core within said second inductor coil so that the sum of the inductances of said first and second inductor coils remains substantially constant.

37. The system of claim 33 wherein said core rotation means includes a link adapted to mechanically link said first and second cores so that said first and second cores rotate in unison.

38. A semiconductor fabrication system for use with an RF generator, comprising:

a semiconductor fabrication chamber having a plasma generation area within said chamber;

a plasma generation coil positioned to couple RF energy into said plasma generation area to maintain a plasma in said plasma generation area, said plasma generation coil having a first end and a second end wherein said first end is adapted to be coupled to said RF generator;

a first variable inductor coupled between said plasma generation coil second end and ground, said first inductor having a first variable inductance and comprising a first inductor coil having a central axis, and a first core adapted to rotate within said first inductor about an axis nonparallel to said first inductor coil central axis to provide said first variable inductance which varies as a function of the position of said first core as said first core rotates; and a second variable inductor adapted to be coupled between said plasma generation coil first end and said RF generator, said second inductor having a second variable inductance and comprising a second inductor coil having a central axis, and a second core adapted to rotate within said second inductor about an axis nonparallel to said second inductor coil central axis to provide said second variable inductance which varies as a function of the position of said second core as said first core rotates, said second core being mechanically coupled to said first core so that said first and second cores rotate in unison.

39. The system of claim 38 wherein said first and second cores are oriented relative to each other so that changes to said first and second inductances of said first and second inductors caused by rotation of said first and second cores are substantially complementary.

40. The system of claim 38 wherein said first and second cores are oriented orthogonally relative to each other.

41. The system of claim 38 further comprising a rotatably mounted shaft wherein said first and second cores are both carried and mechanically coupled by said shaft.

42. The system of claim 41 further comprising a motor coupled to said shaft and adapted to rotate said shaft.

43. The system of claim 38 further comprising a first rotation actuator coupled to said first core and adapted to rotate said first core and a second rotation actuator coupled to said second core and adapted to rotate said second core.

44. The system of claim 43 wherein said second actuator provides a predefined rotation of said second core to compensate a first change in said first inductance caused by rotation of said first core of said first inductor coil by said first actuator, with a second change in said second inductance of said second inductor coil so as to keep a sum of said first and second inductances substantially constant.

45. The system of claim 38 wherein said first core is ring-shaped.

46. The system of claim 45 wherein said second actuator comprises a programmable stepper motor.

47. The system of claim 38 wherein said first core is spiral-shaped.

48. The system of claim 38 wherein said first core comprises a plurality of rings of conductive material.

49. The system of claim 48 wherein said plurality of rings are positioned concentrically on a common center axis which is positioned orthogonal to said axis of rotation.

50. The system of claim 48 wherein said plurality of rings are positioned axially displaced on a common axis which is positioned orthogonal to said axis of rotation.

51. The system of claim 38 wherein said first core is adapted to cause said first variable inductance to vary by at least 0.6 $\mu$Henries as said first core is rotated.

52. A semiconductor fabrication process for sputtering material onto a substrate, the process comprising:

placing a substrate in a semiconductor fabrication chamber having a plasma generation area within said chamber;

energizing a target of said material to sputter said material from said target;

energizing a plasma generation coil carried by said semiconductor fabrication chamber and positioned to couple RF energy into said plasma generation area to ionize said sputtered target material to form a layer of said sputtered target material on said substrate; and rotating a first core of a first inductor coil coupled to said plasma generation coil, so as to shift a voltage distribution in a predetermined path along said plasma generation coil to time-average voltage distributions along said plasma generation coil wherein said first core is adapted to rotate about a rotational axis which is nonparallel to a first inductor coil central axis.

53. The process of claim 52 further comprises rotating a second core of a second inductor coil.

54. The process of claim 53 wherein said first core compensates a first change in a first inductive reactance of said first inductor coil with a second change in a second inductive reactance of said second inductor coil so as to keep a sum of said first and second inductive reactances substantially constant.

55. The process of claim 53 wherein said first and second inductor coils are substantially identical.

56. The process of claim 53 wherein said second core is mechanically linked to said first core.

57. The process of claim 52 wherein said first core is substantially ferromagnetic.

58. The process of claim 52 wherein said first core is substantially electrically conductive.

59. A semiconductor fabrication process comprising:
   placing a substrate in a semiconductor fabrication chamber adjacent a plasma generation area within said chamber;
   energizing a plasma generation coil positioned to couple RF energy into said plasma generation area to maintain a plasma in said plasma generation area adjacent said workpiece and to generate ions to process said workpiece; and
   rotating a first core of a first inductor coil coupled to said plasma generation coil so as to shift a voltage value distribution in a predetermined path along said plasma generation coil wherein said first core is adapted to rotate about a rotational axis which is nonparallel to a first inductor coil central axis.

60. The process of claim 59 further comprising rotating a second core of a second inductor coil coupled to said plasma generation coil.

61. The process of claim 60 wherein said second inductor core rotation occurs simultaneously with said first inductor core rotation.

62. The process of claim 60 wherein the sum of the inductances of said first and second inductors remains substantially constant.

63. The process of claim 60 wherein said first and second cores are oriented orthogonally relative to each other.

64. The process of claim 59 wherein said rotating shifts said voltage value distribution an angular distance of at least 15°.

65. The process of claim 59 wherein said rotating shifts said voltage value distribution an angular distance of at least 90°.

66. The process of claim 59 wherein said rotating shifts said voltage value distribution an angular distance of at least 180°.

67. The process of claim 59 wherein said rotating shifts said voltage value distribution an angular distance of at least 360°.

68. The process of claim 59 wherein said rotating cyclicly increases and decreases said first variable inductance wherein said voltage value distribution is cyclicly shifted back and forth in said predetermined path along said plasma generation coil.

69. The process of claim 68 wherein said rotating shifts said voltage value distribution an angular distance of at least 90° in a half cycle of said cyclic shifting.

70. The process of claim 59 wherein a full rotation of said first core shifts said voltage value distribution back and forth twice in said predetermined path along said plasma generation coil.

71. The process of claim 59 further comprising sputtering a target positioned so that sputtered target material is deposited on said substrate wherein said plasma maintained by said plasma generation coil generates ions by ionizing at least a portion of said sputtered material prior to being deposited onto said substrate.

72. A semiconductor fabrication process, comprising:
   placing a substrate in a semiconductor fabrication chamber adjacent a plasma generation area within said chamber;
   energizing a plasma generation coil positioned to couple RF energy into said plasma generation area to maintain a plasma in said plasma generation area adjacent said workpiece and to generate ions to process said workpiece, said plasma generation coil having a plurality of voltage values distributed along said plasma generation coil; and;
   cyclicly rotating a core of an inductor about a rotational axis which is nonparallel to a central axis of said inductor, to cyclicly shift said distribution of voltages along said plasma generation coil.

* * * * *